(12) United States Patent
Swope (10) Patent No.: US 10,228,670 B2
(45) Date of Patent: Mar. 12, 2019

(54) CHARACTERIZATION USING MULTIPLEXED RESISTANCE READING (71) Applicant: Woodward, Inc., Fort Collins, CO (US)

(72) Inventor: Brian Swope, Janesville, WI (US)

(73) Assignee: Woodward, Inc., Fort Collins, CO (US)

( * ) Notice: Subject to any disclaimer, the term of this patent is extended or adjusted under 35 U.S.C. 154(b) by 175 days.

(21) Appl. No.: 15/380,582

(22) Filed: Dec. 15, 2016

(65) Prior Publication Data

US 2018/0173174 A1 Jun. 21, 2018

(51) Int. Cl.
H01C 10/06 (2006.01)
G05B 15/02 (2006.01)
G01R 27/02 (2006.01)
F02C 7/22 (2006.01)
F02C 9/26 (2006.01)
G01R 27/14 (2006.01)
H04Q 9/00 (2006.01)

(52) U.S. Cl.
CPC .............. G05B 15/02 (2013.01); F02C 7/22 (2013.01); F02C 9/26 (2013.01); G01R 27/02 (2013.01); G01R 27/14 (2013.01); H01C 10/06 (2013.01); H04Q 9/00 (2013.01); G05B 2219/2623 (2013.01)

(58) Field of Classification Search
CPC ......... G05B 15/02; G01R 27/02; H01C 10/06
USPC ....................................................... 307/113
See application file for complete search history.

(56) References Cited

U.S. PATENT DOCUMENTS 3,575,616 A 4/1971 Jordan
4,214,307 A 6/1980 Peterson, Jr. et al.
4,214,308 A 6/1980 Carp
4,269,156 A 5/1981 Drellishak
4,736,367 A 4/1988 Wroblewski et al.
4,907,223 A 3/1990 Wroblewski
5,107,427 A 4/1992 Peter et al.
5,146,172 A 9/1992 Mehr-Ayin et al.
5,936,520 A 8/1999 Luitje et al.
6,138,182 A 10/2000 Hennessy et al.
6,751,942 B2 6/2004 Mahoney et al.
7,204,076 B2 4/2007 Griffiths et al.

(Continued)

FOREIGN PATENT DOCUMENTS

EP 0010303 A1 4/1980
FR 2665989 2/1992

OTHER PUBLICATIONS

International Search Report and Written Opinion in International Application No. PCT/US2017066634 dated Mar. 22, 2018, 11 pages.

Primary Examiner — Adi Amrany
(74) Attorney, Agent, or Firm — Fish & Richardson P.C.

(57) ABSTRACT

The subject matter of this specification can be embodied in, among other things, an identification system includes a first component having a first resistor and a second resistor, a second component having a sensor configured to sense a voltage difference between a first bus and a second bus and a selector signal output port configured to provide a first selector signal and a second selector signal, and a third component having a switching network configured to electrically connect the second bus to the first bus across one or both of the first resistor and the second resistor in response to the first selector signal, and electrically connect the second bus to the first bus across a different one of the first resistor or the second resistor in response to the second selector signal.

20 Claims, 6 Drawing Sheets

(56) References Cited

U.S. PATENT DOCUMENTS

| | | |
|---|---|---|
| 7,237,535 B2 | 7/2007 | Eick et al. |
| 7,587,900 B2 | 9/2009 | Shelby et al. |
| 7,762,080 B2 | 7/2010 | Anson et al. |
| 8,256,222 B2 | 9/2012 | Mahoney et al. |
| 8,291,886 B2 | 10/2012 | Mahoney et al. |
| 8,359,168 B2 | 1/2013 | Lepsch et al. |
| 2007/0044768 A1 | 3/2007 | Eick et al. |
| 2014/0022083 A1 | 1/2014 | Wells et al. |

CHARACTERIZATION USING MULTIPLEXED RESISTANCE READING

BACKGROUND

The following description relates to the communication of characterization data between electrically connected components.

Fuel metering units (FMU) have inherent deviation from desired flow schedules as a result of accuracy limitations in variable differential transformer (VDT) demodulation, pressure droop, friction, fluid leakages and other influences. Various schemes have been invented to counter these effects and improve overall accuracy, but since these schemes usually only address a particular effect there is a limitation to their overall effectiveness.

Previous techniques used to transfer such data have been implemented as memory devices or personality modules in the FMU that are interrogated over a communications bus by a full authority digital engine controller (FADEC). Such solutions require sophisticated electronic circuit assemblies that are capable of surviving in harsh engine environments yet still are able to perform the necessary communications. FADECs are also often limited in the input/output resources needed to communicate with such sophisticated memory devices or personality modules. Some such solutions also add to the cost and complexity of the wiring between the FADEC and the FMU to enable communications between such solutions and the FADEC. These factors can severely reduce how much coded information can be made available to the FADEC, and as a result can reduce the usefulness of a FMU characterization correction scheme.

SUMMARY

In general, this document describes communication of characterization data between electrically connected components.

In a first aspect, an identification system includes a first component having a first resistor and a second resistor, a second component having a sensor configured to sense a voltage difference between a first bus and a second bus and a selector signal output port configured to provide a first selector signal and a second selector signal, and a third component having a switching network configured to electrically connect the second bus to the first bus across one or both of the first resistor and the second resistor in response to the first selector signal, and electrically connect the second bus to the first bus across a different one of the first resistor or the second resistor in response to the second selector signal.

Various implementations can include some, all, or none of the following features. The first component can further include a first port in direct electrical communication with the first resistor and not in direct electrical communication with the second resistor; a second port in direct electrical communication with the second resistor and not in direct electrical communication with the first resistor, and a third port in direct parallel electrical communication with the first resistor and the second resistor, and the first bus is in electrical communication with the third port, and the switching network can be further configured to electrically connect the second bus to the first port in response to the first selector signal, and electrically connect the second bus to the second port in response to the second selector signal. The first component can further include a first port and a second port in electrical communication with the first port across the first resistor in series electrical connection with the second resistor, and the switching network can be further configured to electrically bypass electrical communication between the first port and the second port around one of the first resistor or the second resistor in response to the first selector signal, and not bypass electrical communication around the first resistor or the second resistor in response to the second selector signal. The first component can further include a first port and a second port in electrical communication with the first port across a first electrical path in parallel with a second electrical path, the first electrical path having the first resistor in series electrical connection with a first switch of the switching network, and the second electrical path having the second resistor in series electrical connection with a second switch of the switching network, and the switching network can be further configured to close the first switch and open the second switch in response to the first selector signal, and open the first switch and close the second switch in response to the second selector signal. The second component can further include a current source configured to provide a current between the first bus and the second bus. At least one of the first resistor and the second resistor can be a programmable resistor programmed to provide a selected resistance. The third component can be located remotely from the first component. The second component can include the third component. The first component can be selected from a group including a fuel metering unit, an actuator, a valve, and a line replaceable unit, and the second component can be an engine controller. The first component can further include a line replaceable unit configured to receive a driver signal, wherein the selector signal output port is configured to provide the driver signal as at least one of the first selector signal and the second selector signal. The selector signal output port can be further configured to provide a third selector signal, and the switching network can be configured to electrically connect the second bus to the first bus across one of the first resistor and the second resistor in response to the first selector signal, electrically connect the second bus to the first bus across a different one of the first resistor or the second resistor in response to the second selector signal, and electrically connect the second bus to the first bus across both the first resistor and the second resistor in response to a third selector signal In a second aspect, a method of identifying a component includes providing a first bus and a second bus, providing a first selector signal at a selector port, connecting based on the first selector signal at least one or both of a first resistor and a second resistor between the first bus and the second bus, measuring a first resistance between the first bus and the second bus to determine a first resistance value, providing a second selector signal at the selector port, connecting based on the second selector signal a different one of the first resistor and the second resistor between the first bus and the second bus, and measuring a second resistance between the first bus and the second bus to determine a second resistance value.

Various implementations can include some, all, or none of the following features. The method can further include determining an identity based on the first resistance value and the second resistance value. The method can further include providing a collection of known resistance values and corresponding identity values, comparing the first resistance to the collection of known resistance values to identify a first corresponding identity value, and comparing the second resistance to the collection of known resistance values to identify a second corresponding identity value, wherein the identity is based on the first corresponding identity value and the second corresponding identity value. The method can further include identifying a first coefficient value based on the first resistance value, and identifying a second coefficient value based on the second resistance value, wherein the identity is based on an output value provided by a mathematical formula comprising the first coefficient value and the second coefficient value. A first component can provide the first resistor and the second resistor, a second component can provide the selector signal to the first component and measure the first resistance and the second resistance, and the second component can determine an identity of the first component based on the first resistance value and the second resistance value. The second component can be located remotely from the first component. At least one of the first resistor and the second resistor can be a programmable resistor, and the method can further include programming the programmable resistor to provide a selected one of the first resistance and the second resistance. The method can further include providing a third selector signal at the selector port, connecting based on the third selector signal both the first resistor and the second resistor between the first bus and the second bus, and measuring a third resistance between the first bus and the second bus to determine a third resistance value, wherein connecting, based on the first selector signal, at least one or both of the first resistor and the second resistor between the first bus and the second bus comprises connecting one of the first resistor and the second resistor between the first bus and the second bus. The method can further include providing at least one of the first selector signal and the second selector signal as a driver signal to a line replaceable unit, and driving operation of the line replaceable unit based on the driver signal.

The systems and techniques described here may provide one or more of the following advantages. First, a system can identify components of a system to a control module. Second, the system can identify remotely located components. Third, the system can provide identifying information using electronic components that are sufficiently robust to withstand harsh operating environments, such as engine compartments. Fourth, the system can provide such identification with a small number of wires. Fifth, the system can enable commercial or otherwise "off the shelf" engine controllers to identify and/or characterize remotely located fuel management units or other components. Sixth, the system can be manufactured with greater simplicity and economy than other systems that provide similar functionality. Seventh, the system can be constructed with less weight and/or volume than other systems that provide similar functionality.

The details of one or more implementations are set forth in the accompanying drawings and the description below. Other features and advantages will be apparent from the description and drawings, and from the claims.

DETAILED DESCRIPTION

This document describes systems and techniques for the communication of characterization data between electrically connected components. Generally speaking, fuel metering units (FMU) have inherent deviation from desired flow schedules as a result of accuracy limitations in variable differential transformer (VDT) demodulation, pressure droop, friction, fluid leakages, and other influences.

Still generally speaking, systems to characterize the cumulative effects of some or all of the contributors to inaccuracy for a particular FMU can be used to allow a controlling device such as a full authority digital engine controller (FADEC) or electronic engine controller (EEC) to compensate for a particular FMU's inaccuracies and provide for more accurate overall system performance. For example, if fuel flow of a particular FMU, for a given set of conditions, is known to be 12.5 pph (pounds per hour) low, the FADEC could be configured to increase its command at that point an additional 12.5 pph to account for the inaccuracy.

Still generally speaking, resistor networks can be used in personality modules to provide two or more identifiable resistances, and these resistances can be used to identify or characterize an associated component such as a FMU. While it can be challenging and costly to design complex electronic assemblies (e.g., static computer memory modules) that can function in the harsh environments such as those encountered by FMUs, resistor networks such as those described herein can be suitably designed to function in such harsh environments much more easily and economically than other more complex solutions. Such personality modules can be electrically connected to and interrogated by a control module, such as an engine controller, to read the two or more resistances and determine a characterization value conveyed by the resistances that can be used, for example, to compensate for a particular FMU's performance characteristics.

In addition to being challenging and costly to design complex electronic assemblies, some such assemblies may require the use of complex interconnections in order to communicate characterization data (e.g., multiple parallel conductors, EMI shielding, controlled spacing/twisting of conductors). Some such assemblies may require relatively larger and heavier housings to accommodate levels of cooling and/or vibration isolation needed to protect such complex electronic assemblies, in addition to being able to accommodate the relatively larger electronic assemblies themselves. In the following examples, multiple identifiable resistances are multiplexed over relatively simpler, cheaper, and more robust electrical busses (e.g., using as few as three wires).

Figure 1:
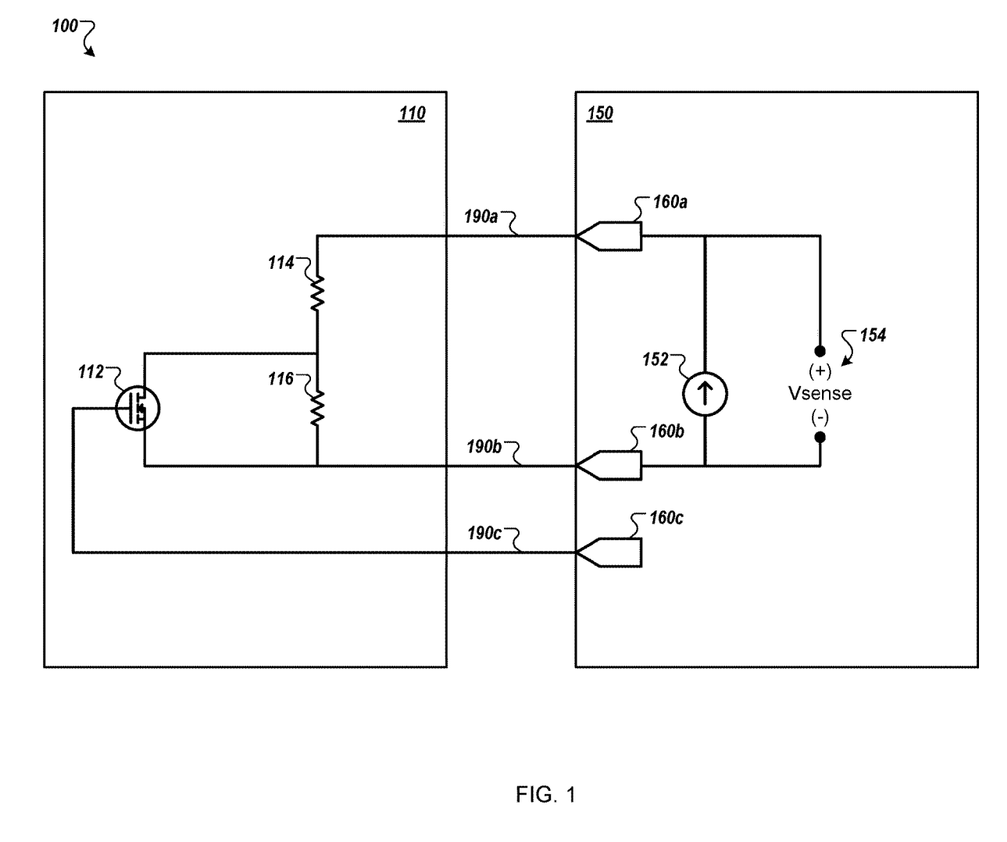
FIG. 1 is a schematic diagram that shows an example of a system for communication of characterization data.

FIG. 1 is a schematic diagram that shows an example system 100 for communication of characterization data. The system 100 includes a personality module 110 and a control module 150. The personality module 110 and the control module 150 are in electrical communication by a collection of buses 190a-190c.

The personality module 110 is a switching network configured to electrically connect the bus 160b to the bus 160a across one or both of a resistor 114 and a resistor 116 in response to a selector signal in a first state (e.g., off), and electrically connect the bus 190b to the bus 190a across a different one of the resistor 114 or the resistor 116 (e.g., bypassing the resistor 116) in response to the selector signal being in a second state (e.g., on). In some embodiments, the personality module 110 can be a portion of or associated with (e.g., attached to) a fuel metering unit (FMU), a line replaceable unit (LRU) (e.g., actuator, torque motor, solenoid, solenoid valve, servo valve, resistance temperature detector (RTD), thermometer, linear or rotary variable differential transformer (LVDT, RVDT), resolver, strain gauge, switch, piezo), or any other appropriate component that can be associated with one or more unique characterization values (e.g., serial number, make and/or model identifier, calibration value, offset value).

In some embodiments, the control module 150 can be a full authority digital engine controller (FADEC), an engine control unit (ECU), an electronic engine controller (EEC), or any other appropriate electronic controller. In some implementations, the system 100 can be used as part of an engine system.

The control module 150 includes a current source 152 and a voltage sensor 154. In general, the current source 152 is used to provide electrical current to resistive loads (which will be described below) and the voltage sensor 154 senses the voltage difference between the bus 190a and 190b, developed by the current across the resistive load(s). By knowing the amount of current being provided by the current source 152 and the voltage measured by the voltage sensor 154, the resistance of the resistive loads can be determined (e.g., using Ohm's law).

The control module 150 includes a collection of ports 160a-160c. The ports 160a-160c provide electrical connections between the control module 150 and the buses 190a-190c. A first side of the current source 152 is connected in parallel with a first side of the voltage sensor 154 to the bus 190a by the port 160a. A second side of the current source 152 is connected in parallel with a second side of the voltage sensor 154 to the bus 190b by the port 160b. The bus 190a is in electrical communication with the bus 190b through a resistor 114 arranged in series with a resistor 116.

The port 160c selectively provides a selector signal (e.g., a control signal, a switching signal) to the bus 190c. The bus 190c carries the selector signal to a controllable switch 112. In some embodiments, the switch 112 can be a transistor (e.g., BJT, FET, MOSFET), a relay, or any other appropriate device that can controllably switch an electrical circuit. The switch 112 is arranged to controllably provide an electrical shunt around the resistor 116.

In such an arrangement, when the switch 112 is open (e.g., the selector signal on bus 190c is in a first state), the bus 190a is connected to the bus 190b through both the resistor 114 and the resistor 116 in series. In such a configuration, the voltage sensed at the voltage sensor 154 is a product of the sum of the resistances of the resistor 114 and the resistor 116. However, when the switch is closed (e.g., the selector signal on bus 190c is in a second state), the bus 190a is connected to the bus 190b through the resistor 114 and the shunt provided by the switch 112, bypassing the resistor 116. In such a configuration, the voltage sensed at the voltage sensor 154 is a product of the resistance of the resistor 114 alone.

As such, the configuration of the system 100 can cause two different resistance values to appear at voltage sensor 154 by toggling the selector signal being provided by the port 160c. For example, the resistor 114 can be a 10K ohm resistor and the resistor 116 can be a 250 ohm resistor. When the selector signal from the port 160c is in the first state, the switch 112 will be open, and current will flow from the port 160a through the resistor 114 and the resistor 116 such that a 10,250 ohm resistance is presented across the voltage sensor 154. When the selector signal from the port 160c is in the second state, the switch 112 will be closed, and current will flow from the port 160a through the resistor 114 and around the resistor 116 such that a 10,000 ohm resistance is presented across the voltage sensor 154.

In some implementations, the multiplexed resistance values of the resistors 114-116 can be read directly to provide characterization information. For example, the identity module 110 may be associated with an FMU that has been measured as deviating from a baseline flow by 12%. The resistor 114 may be used to indicate the tens place of the 12% figure and the resistor 116 may be used to indicate the ones place. For example, a 10 ohm resistor and 2 ohm resistor can be used to represent 10% and 2% respectively (e.g., 10%+2%=12%).

In another example, the values of the resistors 114 and 116 may be used by the control module 150 as two separate variables in a polynomial equation. For example, the resistor 114 can have a resistance of $R_1$ ohms and the resistor 116 can have a resistance of $R_2$ ohms. An adjustment factor for an FMU identified by the identity module 110 can be determined by measuring $R_1$ and $R_2$ and then processing those values through algebraic or other types of equations such as "$y = R_1 x + R_2$" or "$y = x^{R_1} + B^{R_2}$" where x can be the nominal fuel flow and y can be the corrected fuel flow.

In another example, the values of the resistors 114 and 116 may be used by the control module 150 to identify the identity module 110 (e.g., and an FMU associated with the identity module 110). For example, an FMU to be characterized by the identity module 110 might be a "Series 6, Model 9" FMU. The resistor 114 can be configured as a 6K ohm resistor (e.g., to represent the series number), and the resistor 116 can be configured as a 9K ohm resistor (e.g., to represent the model number). When the control signal at the port 160c is toggled, a 9K ohm load and a 15K ohm load (e.g., 9K+6K in series) can be selectably presented at the voltage sensor 154. The control module 150 process these values to determine the series number (e.g., rounding the value of 9K/1000=9) and the model (e.g., rounding (15K−9K)/1000=6). Based on the determined series and model numbers, a corresponding calibration or other adjustment can be made by the control module 150 for the device associated with the identity module 110 (e.g., a "Series 6, Model 9" FMU may require 500 mA for activation and flow of 10 ml per second, whereas a "Series 4, Model 3" FMU may require 100 mA for activation and flow of 20 mL per second).

In another example, the values of the resistors 114 and 116 may be used by the control module 150 to perform a table lookup. For example, the resistor 114 can be configured as a 5K ohm resistor, and the resistor 116 can be configured as a 7K ohm resistor. The control module can toggle the selector signal at the port 160c to determine both resistances, and obtain a row value of 5 (e.g., 5K/1000) and a column value of 7 (e.g., 7K/1000). The control module 150 can use these values to perform a table lookup at row 5, column 7, to determine an identifier, calibration value, or any other appropriate type of information that can be used to characterize the FMU or other device associated with the identity module 110. In some implementations, the values of the resistors 114 and 116 may be used as indices to a full compensation table.

Figure 2:
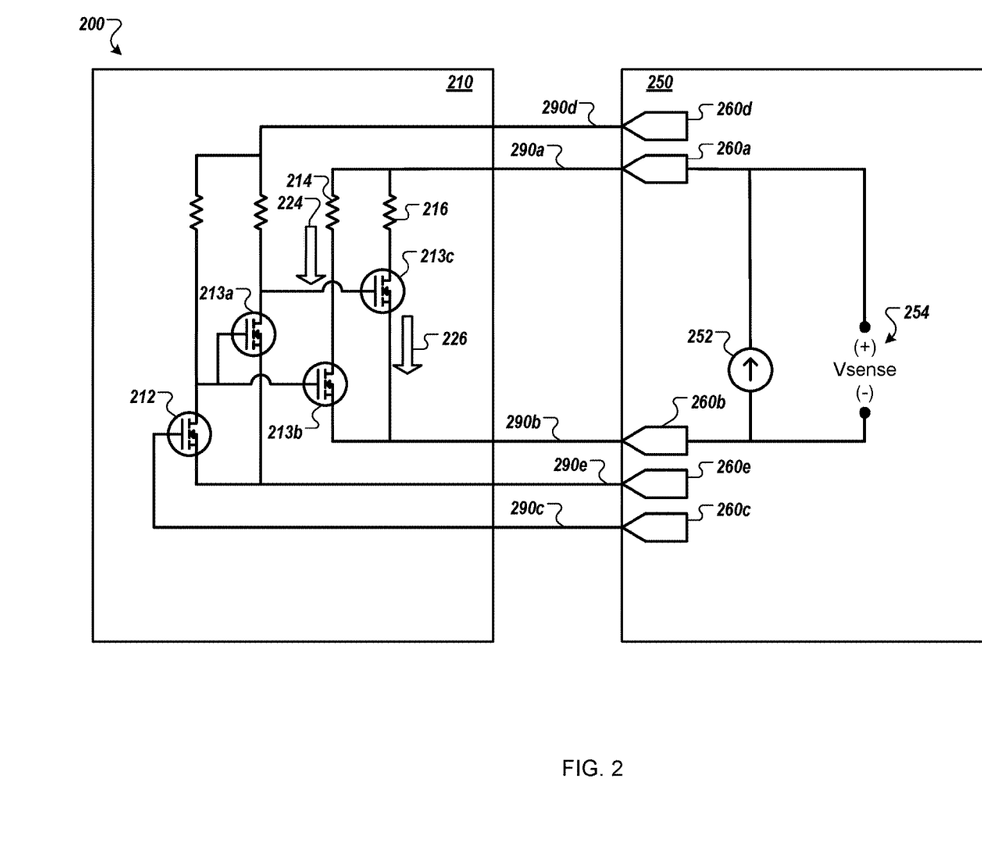
FIG. 2 is a schematic diagram that shows another example of a system for communication of characterization data.

FIG. 2 is a schematic diagram that shows an example system 200 for communication of characterization data. The system 200 includes a personality module 210 and a control module 250. The personality module 210 and the control module 250 are in electrical communication by a collection of buses 290a-290e.

The personality module 210 is a switching network configured to electrically connect the bus 260*b* to the bus 260*a* across a resistor 214 in response to a selector signal in a first state (e.g., off), and electrically connect the bus 260*b* to the bus 260*a* across a resistor 216 in response to the selector signal being in a second state (e.g., on). In some embodiments, the personality module 210 can a portion of or associated with (e.g., attached to) a fuel metering unit (FMU), an LRU, or any other appropriate component that can be associated with one or more unique characterization values (e.g., serial number, make and/or model identifier, calibration value, offset value).

In some embodiments, the control module 250 can be a full authority digital engine controller (FADEC), an engine control unit (ECU), an electronic engine controller (EEC), or any other appropriate electronic controller. In some implementations, the system 200 can be used as part of an engine system.

The control module 250 includes a current source 252 and a voltage sensor 254. In general, the current source 252 is used to provide electrical current to resistive loads (which will be described below) and the voltage sensor 254 senses the voltage difference between the bus 290*a* and 290*b*, developed by the current across the resistive load(s). By knowing the amount of current being provided by the current source 252 and the voltage measured by the voltage sensor 254, the resistance of the resistive loads can be determined (e.g., using Ohm's law).

The control module 250 includes a collection of ports 260*a*-260*e*. The ports 260*a*-260*e* provide electrical connections between the control module 250 and the buses 290*a*-290*e*. A first side of the current source 252 is connected in parallel with a first side of the voltage sensor 254 to the bus 290*a* by the port 260*a*. A second side of the current source 252 is connected in parallel with a second side of the voltage sensor 254 to the bus 290*b* by the port 260*b*. The bus 290*a* is in electrical communication with the bus 290*b* through a resistor 214 arranged in parallel with a resistor 216.

The port 260*c* selectively provides a selector signal (e.g., a control signal, a switching signal) to the bus 290*c*. The bus 290*c* carries the selector signal to a controllable switch 212. The switch 212 is arranged to alternately activate a collection of controllable switches 213*a*-213*c*. In some embodiments, the switches 212 and 213*a*-213*c* can be transistors, relays, or any other appropriate devices that can controllably switch electrical circuits. The port 260*d* provides a voltage on the bus 290*d* that is switched by the switches 212 and 213*a*-213*c*. The port 260*e* provides a common (e.g., ground) for the bus 290*e* and the switches 212 and 213*a*.

In such an arrangement, when the switch 212 is open (e.g., the selector signal on bus 290*c* is in a first state), current from the bus 290*d* is not able to flow through the switch 212 to the bus 290*e* (e.g., ground), and a voltage is presented to the switch 213*a* and the switch 213*b*, closing both of the switches 213*a* and 213*b*. When the switch 213*b* is closed, a current flow path 224 is formed between the bus 290*a* and the bus 290*b* through the resistor 214. When the switch 213*a* is closed, current from the bus 290*d* is shunted to the bus 290*e* (e.g., shorted), and a voltage is absent from the switch 213*c*, opening the switch 213*c* and preventing current from flowing along a current path 226. In this configuration, the voltage sensed at the voltage sensor 254 is a product of the resistance of the resistor 214 but not the resistor 216.

When the switch 212 is closed (e.g., the selector signal on bus 290*c* is in a second state), current from the bus 290*d* is able to flow through the switch 212 to the bus 290*e* (e.g., shorted), and a voltage is not presented to the switch 213*a* and the switch 213*b*, opening both of the switches 213*a* and 213*b*. When the switch 213*b* is open, the current flow path 224 is blocked. When the switch 213*a* is open, current from the bus 290*d* is blocked from the bus 290*e*, and a voltage is presented to the switch 213*c*, closing the switch 213*c* and permitting current to flowing along the current path 226 from the bus 290*a* through the resistor 216 to the bus 290*b*. In this configuration, the voltage sensed at the voltage sensor 254 is a product of the resistance of the resistor 216 but not the resistor 214.

In some embodiments, the configuration of the example system 200 can permit the independent reading of two independent resistors. For example, the resistor 214 can be a 1 k ohm resistor to represent a first characterization value, and a second different characterization value can be represented by a 2 k ohm resistor as the resistor 216. As such, the configuration of the system 200 can cause two different resistance values to appear at voltage sensor 254 by toggling the selector signal being provided by the port 260*c*. In some embodiments, the values of the resistors 214 and 216 can be used in at least the ways that were described previously for the resistors 114 and 116 of FIG. 1.

Figure 3:
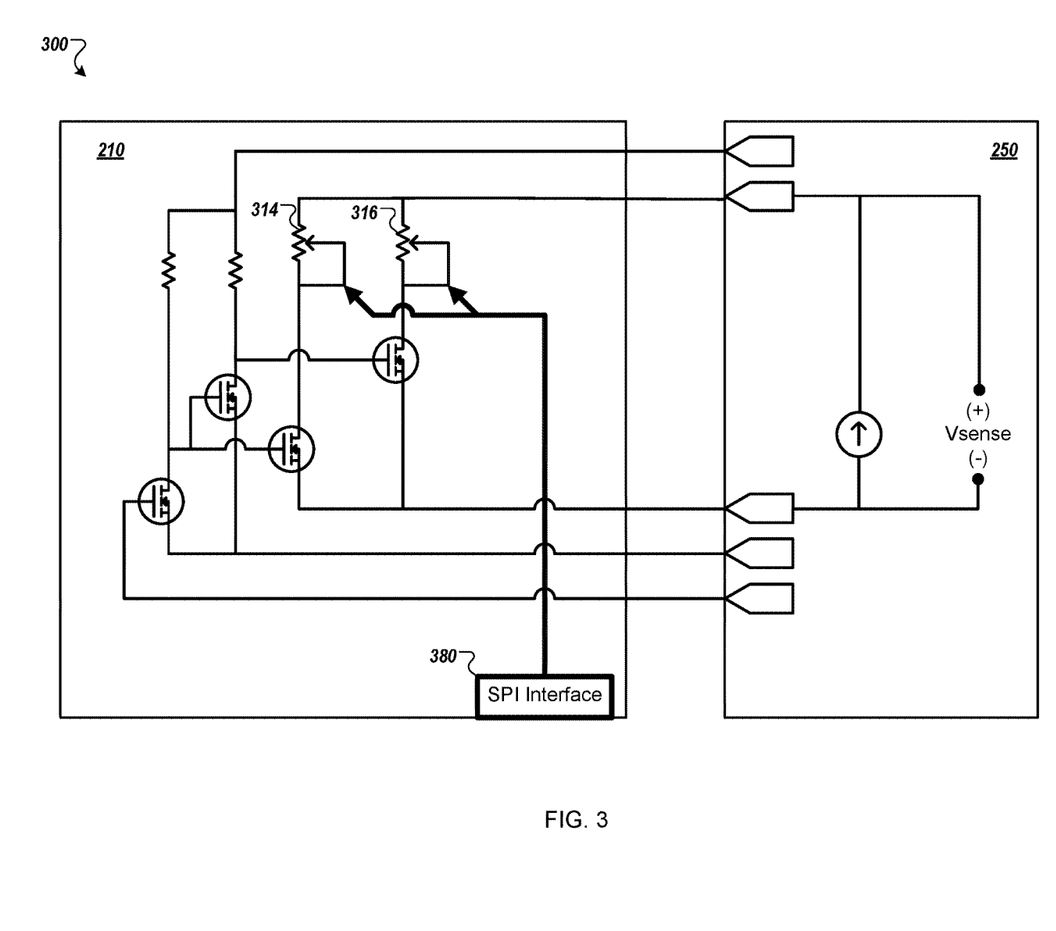
FIG. 3 is a schematic diagram that shows another example of a system for communication of characterization data.

FIG. 3 is a schematic diagram that shows another example of a system 300 for communication of characterization data. The system 300 includes the example personality module 210 and the example control module 250 of the example system 200 of FIG. 2. However, in the system 300, the resistors 214 and 216 of the system 200 have been replaced by a programmable resistor 314 and a programmable resistor 316. The programmable resistors 314 and 316 may be configured through a serial programming interface (SPI) 380. In some implementations, configuration of the resistors 314 and 316 may be performed at the time of manufacture.

In various embodiments, the resistor 314, the resistor 316, and/or any other resistor described in this specification can be a fixed value or an adjustable value (e.g., programmable, trimmable, adjustable) resistor. For example, an FMU to be characterized by the personality module 210 may flow 120 pph too low for a predetermined low flow rate calibration point, and may flow 75 pph too low for a predetermined high flow rate calibration point. As such, a user may access the SPI 380 to program the resistor 314 with a value of 120 k ohms to represent the deviation from the low flow rate, and program the resistor 316 with a value of 75K ohms to represent the deviation from the high flow rate. In some embodiments, the values of the resistors 314 and 316 can be used in at least the ways that were described previously for the resistors 114 and 116 of FIG. 1.

Figure 4:
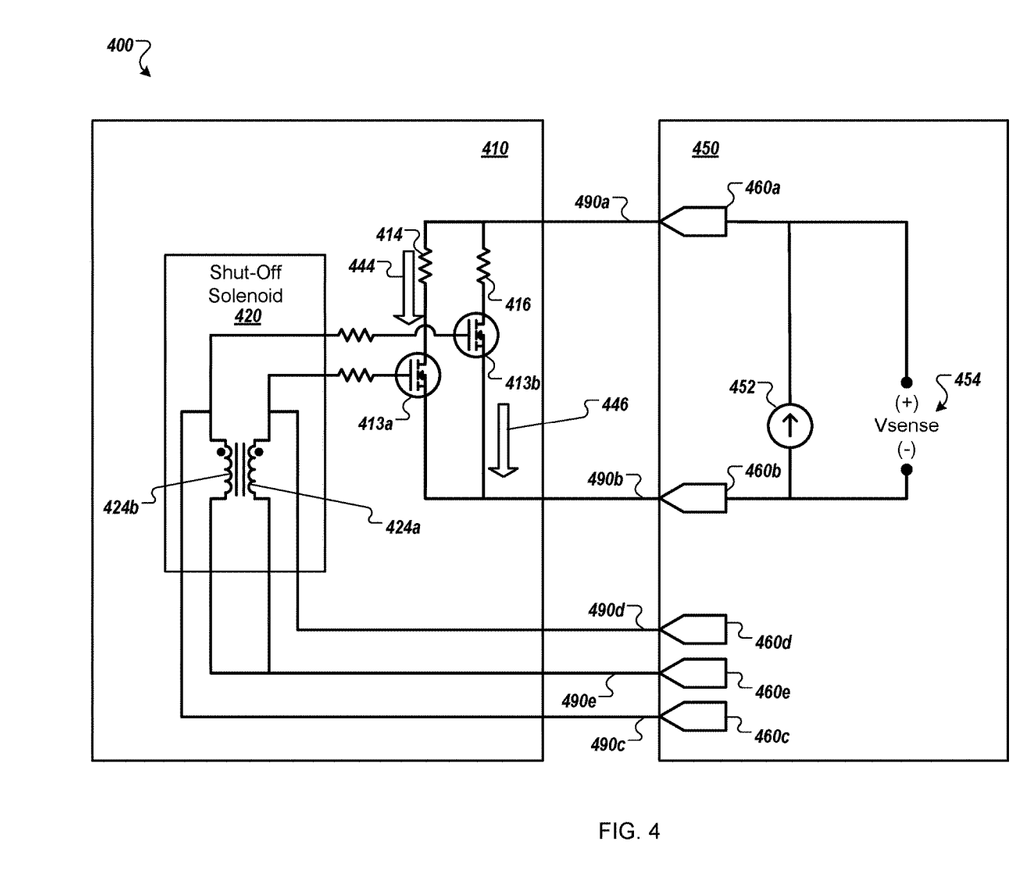
FIG. 4 is a schematic diagram that shows another example of a system for communication of characterization data.

FIG. 4 is a schematic diagram that shows another example of a system 400 for communication of characterization data. The system 400 includes a personality module 410 and a control module 450. The personality module 410 and the control module 450 are in electrical communication by a collection of buses 490*a*-490*e*.

The personality module 410 is a switching network configured to electrically connect the bus 490*b* to the bus 490*a* across a resistor 414 in response to a selector signal in a first state (e.g., off), and electrically connect the bus 490*b* to the bus 490*a* across a resistor 416 in response to the selector signal being in a second state (e.g., on). In some embodiments, the personality module 410 can be a portion of or associated with (e.g., attached to) a fuel metering unit (FMU), an LRU, or any other appropriate component that can be associated with one or more unique characterization values (e.g., serial number, make and/or model identifier, calibration value, offset value).

In some embodiments, the control module 450 can be a full authority digital engine controller (FADEC), an engine control unit (ECU), an electronic engine controller (EEC), or any other appropriate electronic controller. In some implementations, the system 200 can be used as part of an engine system.

The control module 450 includes a current source 452 and a voltage sensor 454. In general, the current source 452 is used to provide electrical current to resistive loads (which will be described below) and the voltage sensor 454 senses the voltage difference between the bus 490*a* and 490*b*, developed by the current across the resistive load(s). By knowing the amount of current being provided by the current source 452 and the voltage measured by the voltage sensor 454, the resistance of the resistive loads can be determined (e.g., using Ohm's law).

The control module 450 includes a collection of ports 460*a*-460*e*. The ports 460*a*-460*e* provide electrical connections between the control module 450 and the buses 490*a*-490*e*. A first side of the current source 452 is connected in parallel with a first side of the voltage sensor 454 to the bus 490*a* by the port 460*a*. A second side of the current source 452 is connected in parallel with a second side of the voltage sensor 454 to the bus 490*b* by the port 460*b*. The bus 490*a* is in electrical communication with the bus 490*b* through a resistor 414 and a controllable switch 413*a* arranged in parallel with a resistor 416 and a controllable switch 413*b* included in the personality module 410. In some embodiments, the switches 213*a*-213*b* can be transistors, relays, or any other appropriate devices that can controllably switch electrical circuits.

The personality module 410 also includes a shut-off solenoid 420. The shut off solenoid includes a coil 422 with a winding 424*a* and a winding 424*b*. In some embodiments, an armature (not shown) can be actuated by energizing one or both of the windings 424*a*-424*b*. The winding 424*a* is energized when the control module 450 provides an appropriate electrical current at the port 460*d*, and the current is carried to the winding 424*a* by the bus 490*d*. The current flows through the winding 424*a* to the bus 490*e*, which is in electrical communication with the port 460*e* (e.g., common, ground). The winding 424*b* is energized when the control module 450 provides an appropriate electrical current at the port 460*c*, and the current is carried to the winding 424*b* by the bus 490*c*. The current flows through the winding 424*b* to the bus 490*e*, which is in electrical communication with the port 460*e*.

The signal provided to the winding 424*a* is also provided to the switch 413*a*, and the signal provided to the winding 424*b* is also provided to the switch 413*b*. In such an arrangement, a control signal provided by the control module to energize the winding 424*a* can also serve as selector signal (e.g., a control signal, a switching signal) to activate the controllable switch 413*a*. Similarly, a control signal provided by the control module to energize the winding 424*b* can also serve as selector signal to activate the controllable switch 213*a*.

In such an arrangement, when the control module 450 energizes the winding 424*a* (e.g., the selector signal is in a first state), the switch 413*a* closes and current from the bus 490*a* is able to flow along a current path 444 through the switch 413*a* and the resistor 414 to the bus 490*b*. In this configuration, the voltage sensed at the voltage sensor 454 is a product of the resistance of the resistor 414 but not the resistor 416.

When the control module 450 energizes the winding 424*b* (e.g., the selector signal is in a second state), the switch 413*b* closes and current from the bus 490*a* is able to flow along a current path 446 through the switch 413*b* and the resistor 416 to the bus 490*b*. In this configuration, the voltage sensed at the voltage sensor 454 is a product of the resistance of the resistor 416 but not the resistor 414.

When both of the windings 424*a* and 424*b* are energized (e.g., the selector signal is in a third state), both of the switches 413*a* and 413*b* are closed and current will flow along the current path 444 in parallel with the current path 446. In this configuration, the voltage sensed at the voltage sensor 454 is a product of the resistance of the resistor 414 in parallel with the resistor 416.

In some implementations, the control module 450 can control the timing at which the voltage sensor 454 is read to coincide with the control of the solenoid 420 to determine if the voltage reading corresponds to the influence of the resistor 414, the resistor 416, or both in parallel. In some implementations, the control module 450 can read the resistance values dynamically (e.g., during operation of an engine in which the solenoid 420 is a component). In some implementations, the control module 450 can read the resistance values at a predetermined time (e.g., a self-check routine prior to engine startup). In some embodiments, the values of the resistors 414 and 416 can be used in at least the ways that were described previously for the resistors 114 and 116 of FIG. 1.

In some implementations, any appropriate form of line replaceable unit (LRU) can be used in addition to or in place of the shut-off solenoid 420. Examples of LRU's can include torque motors, solenoids, solenoid valves, servo valves, resistance temperature detectors (RTD), thermometers, linear or rotary variable differential transformers (LVDT, RVDT), resolvers, strain gauges, switches, piezos, or any other appropriate component that can be actuated by one or more control signals that can also be provided to at least one of two or more resistors configured to provide resistance values that can identify or characterize the FMU or a component that includes the FMU.

In some embodiments, the configuration of the example system 400 can permit the control module 450 to independently read two independent resistors based on control signals already being provided by the control module 450 (e.g., no dedicated control ports or buses are needed to actuate the switching network). Although a solenoid 420 is shown and described in the illustrated example, any appropriate device that can receive two or more control signals can be used (e.g., up/down motor, high/low headlight beams, left/right steering actuator, increment/decrement logic signals).

Figure 5:
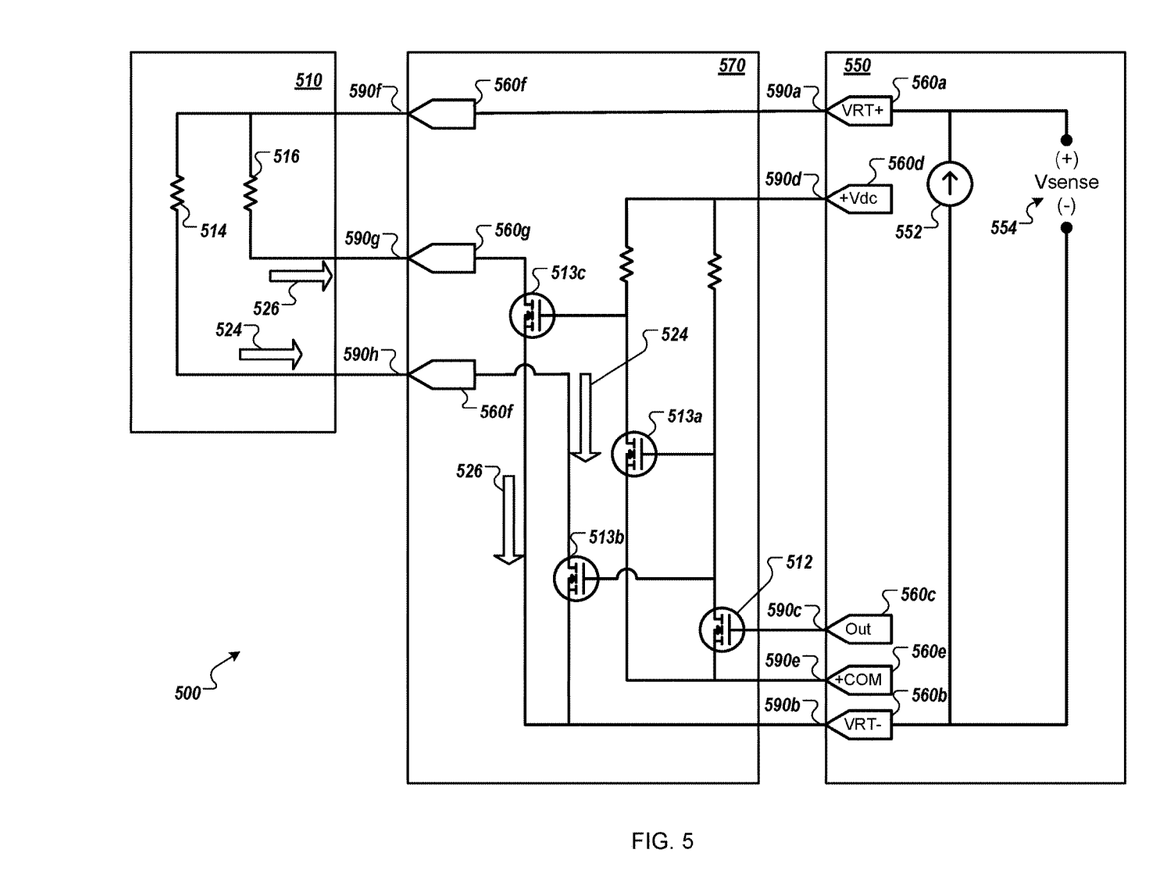
FIG. 5 is a schematic diagram that shows another example of a system for communication of characterization data.

FIG. 5 is a schematic diagram that shows another example of a system for communication of characterization data. The system 500 includes a personality module 510 and a control module 550. The personality module 510 and the control module 550 are in electrical communication through an adapter module 570. The control module is in electrical communication with the adapter module 570 by a collection of buses 590*a*-590*e*, and the personality module 510 is in electrical communication with the adapter module by a collection of buses 590*f*-590*h*.

The adapter module 570 is a switching network configured to electrically connect the bus 590*b* to the bus 590*a* across a resistor 514 in response to a selector signal in a first state (e.g., off), and electrically connect the bus 590*b* to the bus 590*a* across a resistor 516 in response to the selector signal being in a second state (e.g., on). In some embodiments, the personality module 510 can be a portion of or associated with (e.g., attached to) a fuel metering unit (FMU), an LRU, or any other appropriate component that can be associated with one or more unique characterization values (e.g., serial number, make and/or model identifier, calibration value, offset value). In some embodiments, the values of the resistors 514 and 516 can be used in at least the ways that were described previously for the resistors 114 and 116 of FIG. 1.

In some embodiments, the control module 550 can be a full authority digital engine controller (FADEC), an engine control unit (ECU), an electronic engine controller (EEC), or any other appropriate electronic controller. In some implementations, the system 500 can be used as part of an engine system.

In some embodiments, the adapter module 570 can be located proximal to the personality module 510 and remote from the control module 550 (e.g., the personality module 510 and the adapter module 570 can be located near an engine, and the control module 550 can be located away from the engine). In some embodiments, the adapter module 570 can be located proximal to the control module 550 and remote from the personality module 510 (e.g., the personality module 510 can be located near an engine, and the adapter module 570 and the control module 550 can be located away from the engine).

The control module 550 includes a current source 552 and a voltage sensor 554. In general, the current source 552 is used to provide electrical current to resistive loads (which will be described below) and the voltage sensor 554 senses the voltage difference between the bus 590a and 590b, developed by the current across the resistive load(s). By knowing the amount of current being provided by the current source 552 and the voltage measured by the voltage sensor 554, the resistance of the resistive loads can be determined (e.g., using Ohm's law).

The control module 550 includes a collection of ports 560a-560e. The ports 560a-560e provide electrical connections between the control module 550 and the buses 590a-590e. A first side of the current source 552 is connected in parallel with a first side of the voltage sensor 554 to the bus 590a by the port 560a. A second side of the current source 552 is connected in parallel with a second side of the voltage sensor 554 to the bus 590b by the port 560b.

The adapter module 570 includes a collection of ports 560f-560h. The ports 560f-560h provide electrical connections between the adapter module 570 and the buses 590f-590h. The bus 590f is in electrical communication with the bus 590h through a resistor 514, and the bus 590f is in electrical communication with the bus 590g though a resistor 516.

The port 560c selectively provides a selector signal (e.g., a control signal, a switching signal) to the bus 590c. The bus 590c carries the selector signal to a controllable switch 512. The switch 512 is arranged to alternatingly activate a collection of controllable switches 513a-513c. In some embodiments, the switches 512 and 513a-513c can be transistors, relays, or any other appropriate devices that can controllably switch electrical circuits. The port 560d provides a voltage on the bus 590d that is switched by the switches 512 and 513a-513c. The port 560e provides a common (e.g., ground) for the bus 590e and the switches 512 and 513a.

In such an arrangement, when the switch 512 is open (e.g., the selector signal on bus 590c is in a first state), current from the bus 590d is not able to flow through the switch 512 to the bus 590e (e.g., ground), and a voltage is presented to the switch 513a and the switch 513b, closing both of the switches 513a and 513b. When the switch 513b is closed, a current flow path 524 is formed between the bus 590a and the bus 590b through the resistor 514. When the switch 513a is closed, current from the bus 590d is shunted to the bus 590e (e.g., shorted), and a voltage is absent from the switch 513c, opening the switch 513c and preventing current from flowing along a current path 526. In this configuration, the voltage sensed at the voltage sensor 554 is a product of the resistance of the resistor 514 but not the resistor 516.

When the switch 512 is closed (e.g., the selector signal on bus 590c is in a second state), current from the bus 590d is able to flow through the switch 512 to the bus 590e (e.g., shorted), and a voltage is not presented to the switch 513a and the switch 513b, opening both of the switches 513a and 513b. When the switch 513b is open, the current flow path 524 is blocked. When the switch 513a is open, current from the bus 590d is blocked from the bus 590e, and a voltage is presented to the switch 513c, closing the switch 513c and permitting current to flowing along the current path 526 from the bus 590a through the resistor 516 to the bus 590b. In this configuration, the voltage sensed at the voltage sensor 554 is a product of the resistance of the resistor 516 but not the resistor 514.

In some embodiments, the configuration of the example system 500 can permit the independent reading of two independent resistors. For example, the resistor 514 can be a 15 k ohm resistor to represent a first characterization value, and a second different characterization value can be represented by a 22 k ohm resistor as the resistor 516. As such, the configuration of the system 500 can cause two different resistance values to appear at voltage sensor 554 by toggling the selector signal being provided by the port 560c.

Figure 6:
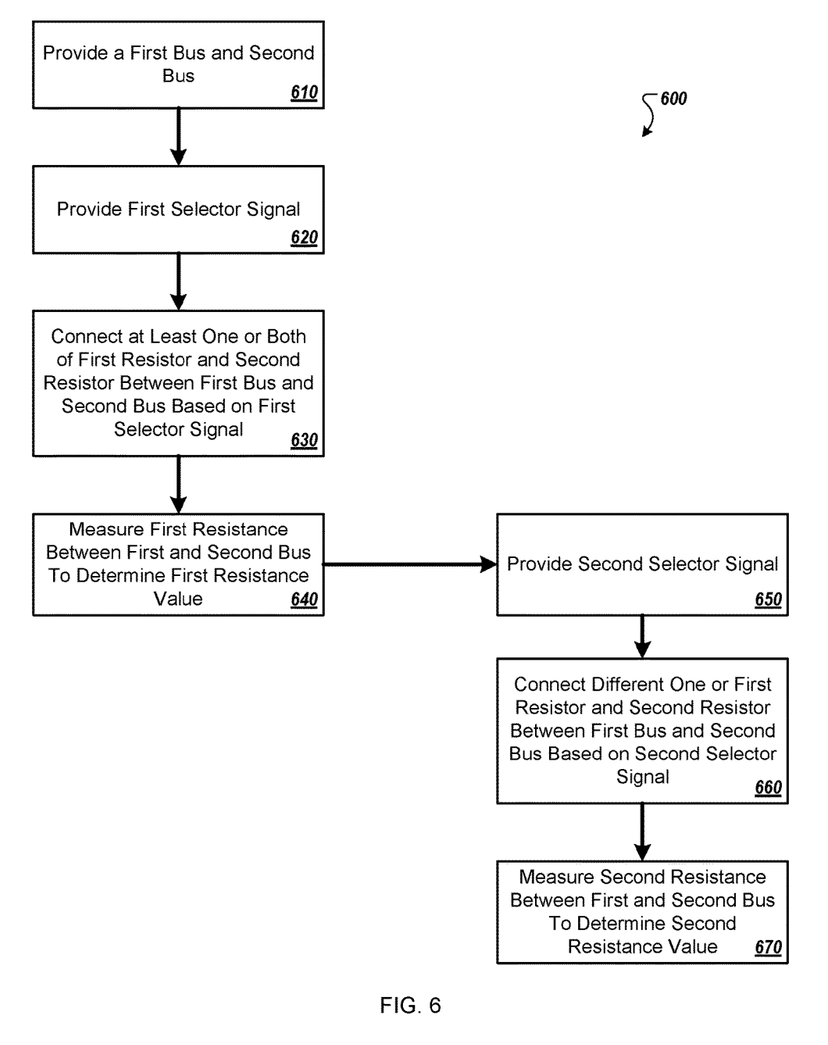
FIG. 6 is a flow diagram of an example process for the communication of characterization data.

FIG. 6 is flow chart that shows an example of a process 600 for the communication of characterization data. In some implementations, the process 600 can be performed by the example systems 100-500 of FIGS. 1-5.

At 610, a first bus and a second bus are provided. For example, the system 100 includes the bus 190a and the bus 190b. In another example, the system 500 includes the bus 590a and the bus 590b.

At 620, a first selector signal is provided at a selector port. For example, the control module 100 can provide a selector signal in a first state (e.g., off) at the port 160c. In another example, the control module 500 can provide a selector signal in a first state (e.g., off) at the port 560c.

At 630, at least one or both of a first resistor and a second resistor are connected between the first bus and the second bus based on the first selector signal. For example, in the example system 100, the resistors 114 and 116 are connected between the bus 190a and the bus 190b when the selector signal is in the first state (e.g., off). In the example system 500, the resistor 514 is connected between the bus 590a and the bus 590b when the selector signal is in the first state (e.g., off).

At 640, a first resistance is measured between the first bus and the second bus to determine a first resistance value. For example, the system 100 develops a resistance, between the bus 190a and the bus 190b, that is based on a sum of the resistances of the resistors 114 and 116 when the selector signal is in the first state (e.g., off). In the example system 500, a resistance based on the resistance of the resistor 514 is developed between the bus 590a and the bus 590b when the selector signal is in the first state (e.g., off).

At 650, a second selector signal is provided at the selector port. For example, the control module 100 can provide a selector signal in a second state (e.g., on) at the port 160c. In another example, the control module 500 can provide a selector signal in a second state (e.g., on) at the port 560c.

At 660, a different one of the first resistor and the second resistor are connected between the first bus and the second bus based on the second selector signal. For example, in the example system 100, the resistor 116 is bypassed through the switch 112, leaving only the resistor 114 connected between the bus 190a and the bus 190b when the selector signal is in the second state (e.g., on). In the example system 500, the resistor 516 is connected between the bus 590a and the bus 590b when the selector signal is in the second state (e.g., on).

At 670, a second resistance is measured between the first bus and the second bus to determine a second resistance value. For example, the system 100 develops a resistance, between the bus 190a and the bus 190b, that is based on the resistance of the resistor 114 when the selector signal is in the second state (e.g., on). In the example system 500, a resistance based on the resistance of the resistor 516 is developed between the bus 590a and the bus 590b when the selector signal is in the second state (e.g., on).

In some implementations, the process 600 can include determining an identity based on the first resistance value and the second resistance value. For example, the resistances of the resistors 114 and 116 can be selected to indicate a serial number, a make/model number, a calibration offset value, or any other value that can be represented directly or indirectly by two numerical resistance values.

In some implementations, the process 600 can include providing a collection of known resistance values and corresponding identity values, comparing the first resistance to the collection of known resistance values to identify a first corresponding identity value, and comparing the second resistance to the collection of known resistance values to identify a second corresponding identity value, wherein the identity is based on the first corresponding identity value and the second corresponding identity value. For example, the control module 550 can be preprogrammed with a collection of lookup values that correspond to predetermined resistance ranges. In examples such as this, resistances between 8 k ohms and 12 k ohms can be used to represent a product model "X", and resistances for the resistor 514 between 18 k ohms and 22 k ohms can be used to represent a product model "Y". Similarly, resistances for the resistor 516 between 2 k ohms and 4 k ohms can be used to represent a product series "A", resistances between 5 k ohms and 7 k ohms can be used to represent a product series "B". As such, a predetermined combination of the resistors 514 and 516 can be used in the personality module 510 to represent an FMU that is a "Model X, Series A", a "Model X, Series B", a "Model Y, Series A", or a "Model Y, Series B" type FMU.

In some implementations, the process 600 can also include identifying a first coefficient value based on the first resistance value, and identifying a second coefficient value based on the second resistance value, wherein the identity is based on an output value provided by a mathematical formula comprising the first coefficient value and the second coefficient value. For example, the resistor 114 can be determined to be "M" ohms, and the resistor 116 can be determined to be "N" ohms. The resistance values "M" and "N" can be applied to an equation such as "$F=M^2+N$" to determine a flow offset "F" for an FMU identified by the personality module 110.

In some implementations, a first component can provide the first resistor and the second resistor, a second component can provide the selector signal to the first component and measures the first resistance and the second resistance, and the second component can determine an identity of the first component based on the first resistance value and the second resistance value. For example, in the example system 100 the personality module 110 includes the resistors 114 and 116, and the control module 150 provides the selector signal at the port 160c and reads the resistances developed across the ports 160a and 160b to determine the identity of an FMU, an LRU, or other component associated with the personality module 110.

In some implementations the second component can be located remotely from the first component. For example, the control module 150 can be located remotely away from a harsh engine environment, and the personality module 110 can be located in, on, or near an engine component that is within an engine environment.

In some implementations, at least one of the first resistor and the second resistor can be a programmable resistor, and the process 600 can also include programming the programmable resistor to provide a selected one of the first resistance and the second resistance. For example, an FMU can be measured to determine that it flows 10 ppm higher than specified at a first test flow point, and flows 50 ppm higher than specified at a second test flow point. In examples such as this, the resistor 314 can be accessed through the SPI 380 and set to a 10 ohm resistance (e.g., to represent the 10 ppm deviation), and the resistor 316 can be accessed through the SPI 480 and set to a 50 ohm resistance (e.g., to represent the 50 ppm deviation).

In some implementations, the process 600 can also include providing a third selector signal at the selector port, connecting, based on the third selector signal, both the first resistor and the second resistor between the first bus and the second bus, and measuring a third resistance between the first bus and the second bus to determine a third resistance value, wherein connecting, based on the first selector signal, at least one or both of the first resistor and the second resistor between the first bus and the second bus comprises connecting one of the first resistor and the second resistor between the first bus and the second bus. For example, in the example system 400, a signal can be provided at the port 460c to present the resistance of the resistor 414 at the voltage sensor 454, a signal can be provided at the port 460d to present the resistance of the resistor 416 at the voltage sensor 454, and signals can be provided at the ports 460c and 460d simultaneously to present the resistance of the resistors 414 and 416 in parallel at the voltage sensor 454.

In some implementations, the process 600 can include providing at least one of the first selector signal and the second selector signal as a driver signal to a line replaceable unit (LRU), and driving operation of the line replaceable unit based on the driver signal. For example, the shut-off solenoid 420 can be an LRU that can be driven by selected combinations of signals provided at the ports 460c and 460d.

Although a few implementations have been described in detail above, other modifications are possible. For example, the logic flows depicted in the figures do not require the particular order shown, or sequential order, to achieve desirable results. In addition, other steps may be provided, or steps may be eliminated, from the described flows, and other components may be added to, or removed from, the described systems. In another example, the resistors 114 and 116 could be implemented to characterize or identify components other than an FMU, such as an actuator, a remote valve, a line replaceable unit or any other appropriate component that can be identified or characterized, directly or indirectly, by two or more resistance values. Accordingly, other implementations are within the scope of the following claims.

What is claimed is:

1. An identification system comprising:
   a first component comprising:
      a first resistor; and
      a second resistor;
   a second component comprising:
      a sensor configured to sense a voltage difference between a first bus and a second bus; and
      a selector signal output port configured to provide a first selector signal and a second selector signal; and
   a third component comprising:
      a switching network configured to electrically connect the second bus to the first bus across one of the first resistor and the second resistor in response to the first selector signal, and electrically connect the second bus to the first bus across a different one of the first resistor or the second resistor in response to the second selector signal.

2. The identification system of claim 1, wherein:
   the first component further comprises a first port in direct electrical communication with the first resistor and not in direct electrical communication with the second resistor; a second port in direct electrical communication with the second resistor and not in direct electrical communication with the first resistor, and a third port in direct parallel electrical communication with the first resistor and the second resistor, and the first bus is in electrical communication with the third port; and
   the switching network is further configured to electrically connect the second bus to the first port in response to the first selector signal, and electrically connect the second bus to the second port in response to the second selector signal.

3. The identification system of claim 1, wherein:
   the first component further comprises a first port and a second port in electrical communication with the first port across the first resistor in series electrical connection with the second resistor; and
   the switching network is further configured to electrically bypass electrical communication between the first port and the second port around one of the first resistor or the second resistor in response to the first selector signal, and not bypass electrical communication around the first resistor or the second resistor in response to the second selector signal.

4. The identification system of claim 1, wherein:
   the first component further comprises a first port and a second port in electrical communication with the first port across a first electrical path in parallel with a second electrical path, the first electrical path comprising the first resistor in series electrical connection with a first switch of the switching network, and the second electrical path comprising the second resistor in series electrical connection with a second switch of the switching network; and
   the switching network is further configured to close the first switch and open the second switch in response to the first selector signal, and open the first switch and close the second switch in response to the second selector signal.

5. The identification system of claim 1, wherein the second component further comprises a current source configured to provide a current between the first bus and the second bus.

6. The identification system of claim 1, wherein at least one of the first resistor and the second resistor is a programmable resistor programmed to provide a selected resistance.

7. The identification system of claim 1, wherein the third component is located remotely from the first component.

8. The identification system of claim 1, wherein the second component comprises the third component.

9. The identification system of claim 1, wherein the first component is selected from a group comprising a fuel metering unit, an actuator, a valve, and a line replaceable unit, and the second component is an engine controller.

10. The identification system of claim 1, wherein the first component further comprises a line replaceable unit configured to receive a driver signal, the selector signal output port configured to provide the driver signal as at least one of the first selector signal and the second selector signal.

11. The identification system of claim 1, wherein the selector signal output port is further configured to provide a third selector signal, and the switching network is configured to electrically connect the second bus to the first bus across one of the first resistor and the second resistor in response to the first selector signal, electrically connect the second bus to the first bus across a different one of the first resistor or the second resistor in response to the second selector signal, and electrically connect the second bus to the first bus across both the first resistor and the second resistor in response to a third selector signal.

12. A method of identifying a component, the method comprising:
   providing a first bus and a second bus;
   providing a first selector signal at a selector port;
   connecting, based on the first selector signal, a first resistor between the first bus and the second bus;
   measuring a first resistance between the first bus and the second bus to determine a first resistance value;
   providing a second selector signal at the selector port;
   connecting, based on the second selector signal, a second resistor between the first bus and the second bus; and
   measuring a second resistance between the first bus and the second bus to determine a second resistance value.

13. The method of claim 12, further comprising determining an identity based on the first resistance value and the second resistance value.

14. The method of claim 13, further comprising:
   providing a collection of known resistance values and corresponding identity values;
   comparing the first resistance to the collection of known resistance values to identify a first corresponding identity value; and
   comparing the second resistance to the collection of known resistance values to identify a second corresponding identity value;
   wherein the identity is based on the first corresponding identity value and the second corresponding identity value.

15. The method of claim 13, further comprising:
   identifying a first coefficient value based on the first resistance value; and
   identifying a second coefficient value based on the second resistance value;
   wherein the identity is based on an output value provided by a mathematical formula comprising the first coefficient value and the second coefficient value.

16. The method of claim 12, wherein a first component provides the first resistor and the second resistor, a second component provides the selector signal to the first component and measures the first resistance and the second resistance, and the second component determines an identity of the first component based on the first resistance value and the second resistance value.

17. The method of claim 16, wherein the second component is located remotely from the first component.

18. The method of claim 12, wherein at least one of the first resistor and the second resistor is a programmable resistor, and the method further comprises programming the programmable resistor to provide a selected one of the first resistance and the second resistance.

19. The method of claim 12, further comprising:
providing a third selector signal at the selector port;
connecting, based on the third selector signal, both the first resistor and the second resistor between the first bus and the second bus; and
measuring a third resistance between the first bus and the second bus to determine a third resistance value.

20. The method of claim 12, further comprising:
providing at least one of the first selector signal and the second selector signal as a driver signal to a line replaceable unit; and
driving operation of the line replaceable unit based on the driver signal.

* * * * *